United States Patent
Yoo

(10) Patent No.: US 7,939,924 B2
(45) Date of Patent: *May 10, 2011

(54) STACK TYPE BALL GRID ARRAY PACKAGE AND METHOD FOR MANUFACTURING THE SAME

(75) Inventor: Cheol-Joon Yoo, Cheonan (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 336 days.

This patent is subject to a terminal disclaimer.

(21) Appl. No.: 11/976,253

(22) Filed: Oct. 23, 2007

(65) Prior Publication Data

US 2008/0042253 A1 Feb. 21, 2008

Related U.S. Application Data

(62) Division of application No. 10/834,186, filed on Apr. 29, 2004, now Pat. No. 7,298,033.

(30) Foreign Application Priority Data

Jun. 30, 2003 (KR) .................. 10-2003-0043574

(51) Int. Cl.
*H01L 23/02* (2006.01)
(52) U.S. Cl. . 257/686; 257/777; 257/738; 257/E23.069; 257/E25.013; 438/109
(58) Field of Classification Search .............. 257/738, 257/686, E21.506, E23.023, E25.013, E25.023, 257/E23.02, E23.021, E23.069, 777; 438/109
See application file for complete search history.

(56) References Cited

U.S. PATENT DOCUMENTS

| | | | |
|---|---|---|---|
| 6,291,259 B1* | 9/2001 | Chun | 438/106 |
| 6,650,007 B2 | 11/2003 | Moden et al. | |
| 6,700,783 B1 | 3/2004 | Liu et al. | |
| 6,778,404 B1 | 8/2004 | Bolken et al. | |
| 6,798,049 B1* | 9/2004 | Shin et al. | 257/678 |
| 7,298,033 B2* | 11/2007 | Yoo | 257/686 |
| 7,388,294 B2* | 6/2008 | Klein et al. | 257/778 |
| 2003/0137041 A1 | 7/2003 | Blackshear et al. | |
| 2003/0170450 A1* | 9/2003 | Stewart et al. | 428/343 |

FOREIGN PATENT DOCUMENTS

| | | |
|---|---|---|
| JP | 11-354669 | 12/1999 |
| JP | 2002-170906 | 6/2002 |

(Continued)

OTHER PUBLICATIONS

Machine Translation of KR2000-0056804.*

(Continued)

*Primary Examiner* — David S Blum
*Assistant Examiner* — Jessica Hall
(74) *Attorney, Agent, or Firm* — Muir Patent Consulting, PLLC

(57) ABSTRACT

A stacked BGA package and a method for manufacturing the stacked BGA package, with reduced size and/or height of a unit package, which may also reduce an electrical connection length. The stacked BGA package may include a base BGA package having at least one semiconductor chip, and a plurality of BGA packages which are stacked on the base BGA package. A plurality of solder balls may electrically connect the base BGA package and the plurality of BGA packages and may then be sealed to reduce the likelihood of damage.

23 Claims, 10 Drawing Sheets

FOREIGN PATENT DOCUMENTS

| | | |
|---|---|---|
| JP | 2003-086733 | 3/2003 |
| JP | 2004-172157 | 6/2004 |
| KR | 10-2000-0056804 | 9/2000 |
| KR | 10-2000-0056804 A | 9/2000 |
| KR | 10-0375168 | 2/2003 |

OTHER PUBLICATIONS

Korean Office Action dated Sep. 30, 2005 with English translation.

* cited by examiner

STACK TYPE BALL GRID ARRAY PACKAGE AND METHOD FOR MANUFACTURING THE SAME

CROSS REFERENCE TO RELATED APPLICATIONS

This is a Divisional Application of application Ser. No. 10/834,186, filed Apr. 29, 2004, now U.S. Pat. No. 7,298,033 which is a U.S. nonprovisional patent application claiming priority under 35 U.S.C. §119 to Korean Patent Application No. 2003-43574, filed on Jun. 30, 2003, the contents of both of which are hereby incorporated by reference in their entirety.

BACKGROUND OF THE INVENTION

1. Field of the Invention

The present invention relates generally to a semiconductor package and a method for manufacturing the same. More particularly, the present invention relates to a stack type ball grid array (BGA) package including one or more semiconductor chips and a method for manufacturing the same.

2. Description of Related Art

Electronic industries continue to seek products, such as mobile phones and PDAs that are lighter, faster, smaller, multi-functional, more reliable and more cost-effective. In order to meet the requirement of the electronic industries, semiconductor devices have become increasingly integrated. A representative semiconductor package using solder balls (instead of connecting pins) is a BGA package and a representative packaging process adopted in integrated semiconductor packages is a chip scale package (CSP).

Demand for more compact semiconductor devices with larger capacity has resulted in the development of stacked BGA packages. In general, a stacked BGA package have been adopted because of the possibility of increasing the memory capacity of a semiconductor package by two or more times, as a result of stacking two or more packages.

FIG. 1 is a cross-sectional view of a conventional stacked BGA package using a flexible printed circuit board 20. Referring to FIG. 1, the conventional stacked BGA package may typically include the flexible printed circuit board 20 between a first package 10 and a second package 30. The first and second packages 10 and 30 may include package bodies 12 and 32 with a semiconductor chip (not shown) and solder balls 14 and 34 exposed outside of the package bodies 12 and 32, respectively. Also, the solder balls 14 and 34 may be arranged to correspond each other. The flexible printed circuit board 20 may include at least one first portion 21 which is placed between the solder balls 14 and 34, and a second portion 22 which are extended from the first portion 21. The second portion 22 may be attached to a surface of the second package 30 surrounding a side portion of the second package 30. In addition, the second portion 22 may include one or more external connection terminals 40. As shown in FIG. 1, solder balls 14 and 34 may be provided on both the top and bottom of each package 10 and 30. Further, a passivation layer may be placed between the solder balls 14 and/or a film, such as a Cu film, may be placed between the solder balls 14 and 34.

As described above, the conventional stacked BGA package has advantages, for example, decreasing the package size and/or increasing the capacity of a unit package, by forming the solder balls 14 and 34 on the bottom of the chips. However, the conventional stacked BGA package using the flexible printed circuit board 20 may extend the electrical connecting length between the first and second package 10 and 30. In this case, the flexible printed circuit board 20 should be used to manufacturing the stacked BGA package.

SUMMARY OF THE INVENTION

Exemplary embodiments of the present invention provide a stacked BGA package including a plurality of BGA packages mounted on the base BGA package which are electrically connected via a conductive circuit layer and/or a plurality of solder balls. Other exemplary embodiments of the present invention provide a unit BGA package which may be electrically connected via a conductive circuit layer and/or a plurality of solder balls to other BGA packages. Other exemplary embodiments of the present invention provide a method of manufacturing a stacked BGA package and/or a unit BGA package.

Exemplary embodiments of the present invention provide a method of manufacturing a stacked BGA package. According to exemplary embodiments of the present invention, a stacked BGA package includes a base BGA package with at least one semiconductor chip; a plurality of BGA packages with at least one semiconductor chip mounted on the base BGA package; and a plurality of solder balls electrically connected to the base BGA package and the plurality of BGA packages.

In an exemplary embodiment, the stacked BGA package may include the base BGA package and the plurality of BGA packages mounted on the base BGA package, each BGA package including a printed circuit board with a plurality of wire bonding pads, a plurality of solder ball landing pads electrically connected to the plurality of wire bonding pads; at least one semiconductor chip with a plurality of bonding pads may be mounted on the printed circuit board; a plurality of bonding wires electrically connected to the plurality of bonding pads and the plurality of solder ball landing pads; an encapsulant sealing a portion of the printed circuit board to protect the plurality of wire bonding pads, the plurality of bonding pads and/or the plurality of bonding wires; and the plurality of solder balls connected to the solder ball landing pads of the printed circuit board.

In an exemplary embodiment, at least one semiconductor chip may be face up with respect to the printed circuit board, and the base BGA package and the plurality of BGA packages may be exposed on the active surface of the upper semiconductor chip, excluding the upper BGA package of the plurality of BGA packages. In an exemplary embodiment, the encapsulation of the upper BGA package may be sealed on the active surface of the upper semiconductor chip.

In an exemplary embodiment, the stacked BGA package including a conductive circuit layer may be formed between an exposed upper semiconductor chip and the solder balls which are attached to the corresponding printed circuit board, and the conductive circuit layer (which may be a tape), the conductive circuit layer with solder ball landing pads and conductive patterns which are connected to the plurality of bonding pads. In an exemplary embodiment, the conductive circuit layer with solder ball landing pads and conductive patterns may be formed the same as a metal layer to be used for the bonding pad.

In an exemplary embodiment, the solder ball landing pads of the conductive circuit layer may be arranged to correspond to the solder ball landing pads of the printed circuit board, and the solder balls may be attached to contact between the solder ball landing pads of the conductive circuit layer and the solder ball landing pads of the printed circuit board. In an exemplary embodiment, the solder ball connected to the plurality of BGA packages may be sealed by the encapsulant. In an exemplary embodiment, the base BGA package and/or the plurality of BGA packages include one or more semiconductor chips.

Another exemplary embodiment of the present invention provides a stacked BGA package with n (n>1) BGA packages sequentially stacked and connected, each BGA package including a printed circuit board with a plurality of wire bonding pads, a plurality of solder ball landing pads electrically connected to the plurality of wire bonding pads; at least one chip with a plurality of bonding pads mounted on the printed circuit board; a plurality of bonding wires electrically connected to the plurality of bonding pads and the plurality of solder ball landing pads; an encapsulant sealing the plurality of wire bonding pads, the plurality of bonding pads and the plurality of bonding wires; and at least one solder ball connected to the solder ball landing pads of the printed circuit board; and a conductive circuit layer formed on a top of the n−1 BGA packages, and electrically connected to the upper semiconductor chip, wherein the conductive circuit layer may be electrically connected to the solder balls of the adjacent BGA package.

In an exemplary embodiment, the n BGA packages include one or more semiconductor chips. Also, the solder ball of the n BGA package may be sealed by the encapsulant.

An exemplary embodiment of the present invention provides a method of manufacturing a stacked BGA package, said method including: preparing a BGA package including at least one semiconductor chip; forming a conductive circuit layer on the BGA package to electrically connect the semiconductor chip; and stacking at least one BGA package on the conductive circuit layer.

In an exemplary embodiment, the method may further include preparing the BGA package including preparing a printed circuit board including a plurality of wire bonding pads, a plurality of solder ball landing pads electrically connected to the plurality of wire bonding pads; mounting a first semiconductor chip including a plurality of bonding pads on the printed circuit board; electrically connecting a plurality of bonding wires to the plurality of bonding pads on the first semiconductor chip and the plurality of wire bonding pads on the printed circuit board; mounting a second semiconductor chip including a plurality of bonding pads on the first semiconductor chip; electrically connecting the plurality of bonding wires to the plurality of bonding pads of the second semiconductor chip and the plurality of wire bonding pads on the printed circuit board; sealing a portion of the printed circuit board to protect the plurality of wire bonding pads, the plurality of bonding pads and bonding wires; and connecting at least one solder ball to the solder ball landing pads of the printed circuit board.

The exemplary method may further include forming the conductive circuit layer as a tape with conductive patterns on the BGA package, the conductive circuit layer being connected to a plurality of solder ball landing pads and bonding pads of the second semiconductor chip. Also, the method may further include sealing the upper BGA package by covering the active layer of the second semiconductor chip.

The method may further include sealing the solder ball(s) being connected to the BGA packages after connecting the solder ball(s). Also, the method may further include forming the plurality of solder ball landing pads, the conductive patterns connected to the plurality of solder ball landing pads, and/or the bonding pads simultaneously.

BRIEF DESCRIPTION OF THE DRAWINGS

The present invention will become more readily apparent through the following detailed description of exemplary embodiments of the present invention, made with reference to the attached drawings, in which.

DETAILED DESCRIPTION OF EXEMPLARY EMBODIMENTS

The present invention will now be described more fully with reference to the accompanying drawings, in which exemplary embodiments of the invention are shown. It should be understood, however, that exemplary embodiments of the present invention described herein can be modified in form and detail without departing from the spirit and scope of the invention. Accordingly, the exemplary embodiments described herein are provided by way of example and not of limitation, and the scope of the present invention is not restricted to the particular embodiments described herein.

Figure 1:
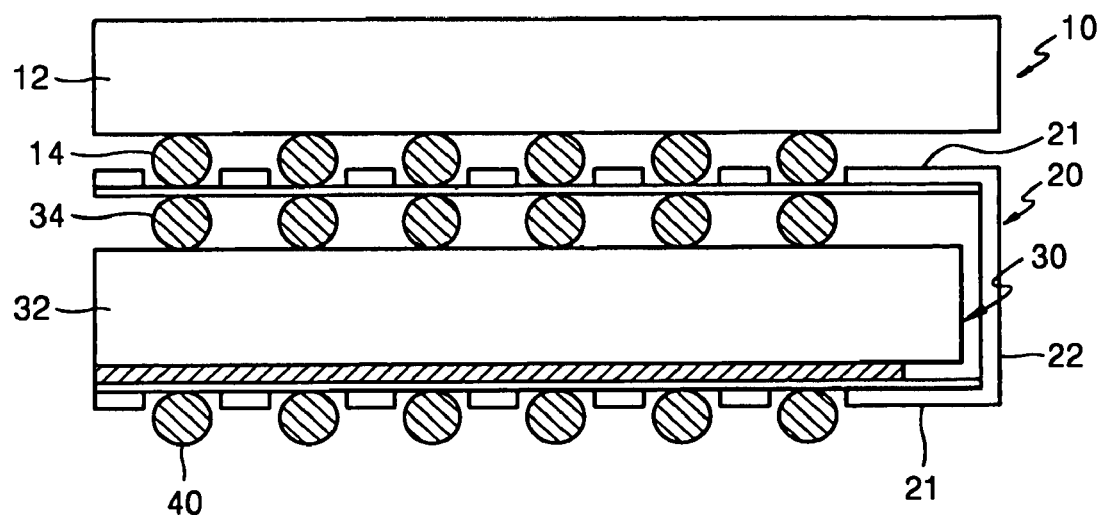
FIG. 1 is a cross-sectional view of a conventional stacked BGA package using a flexible printed circuit board.
Figure 2:
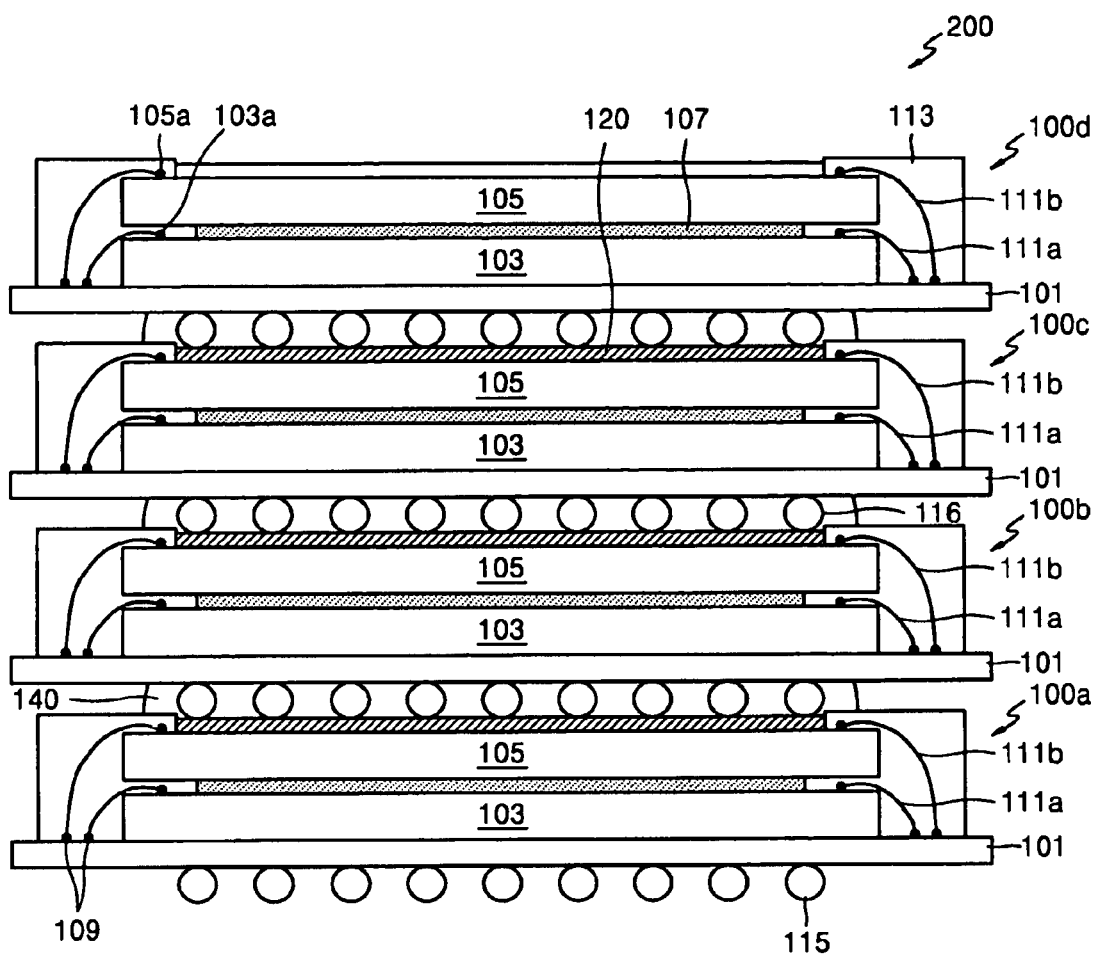
FIG. 2 is a cross-sectional view of a stacked BGA package including a multi chip package according to an exemplary embodiment of the present invention.

Referring to FIG. 2, according to an exemplary embodiment of the present invention, a stacked BGA package 200 may include a plurality of BGA packages 100a through 100d. Each unit BGA package 100a through 100d may include at least one semiconductor chip, e.g., two semiconductor chips 103 and 105. The plurality of BGA packages 100a through 100d may be electrically connected by a series of solder balls 115 and 116, respectively. The series of solder balls 115 and 116 may supply an external signal to the semiconductor chips 103 and 105 in the plurality of BGA packages 100a through 100d, respectively. In addition, a conductive circuit layer 120 may be formed on the top of the plurality of BGA packages 100a through 100c.

Figure 3:
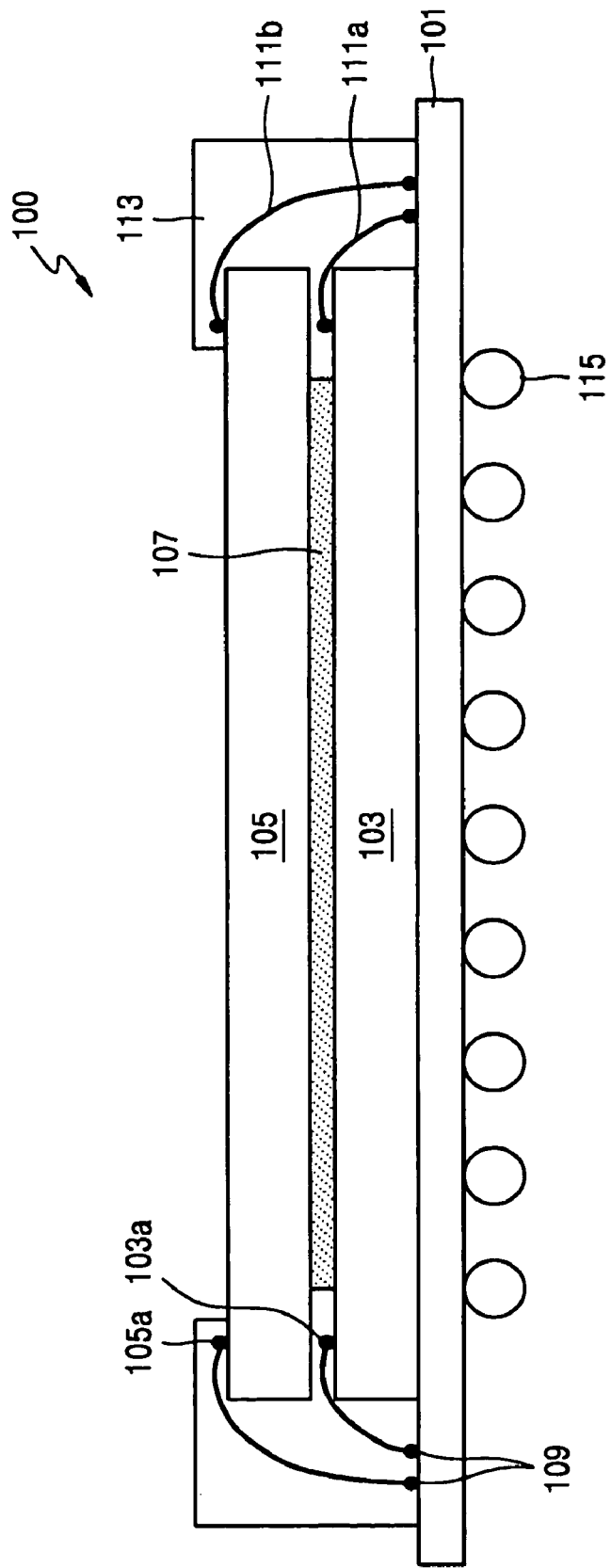
FIG. 3 is a cross-sectional view of an exemplary embodiment of a unit BGA package according to FIG. 2.

With reference to FIG. 3, a unit BGA package 100 may include a printed circuit board 101, at least one semiconductor chip, e.g., two or more semiconductor chips 103 and 105, on the printed circuit board 101. According to an exemplary embodiment of the present invention, the first and second semiconductor chips 103 and 105 are sequentially stacked, and an active surface of the first and second semiconductor chips 103 and 105 are face up with respect to the printed circuit board 101. Also, a series of bonding pads 103a and 105a may be arranged on a peripheral area of the first and second semiconductor chips 103 and 105 and the first and second semiconductor chips 103 and 105 may be attached by an adhesive layer 107. The adhesive layer 107 may be formed to expose the bonding pads 103a on the first semiconductor chip 103. In addition, the series of bonding pads 103a and 105b may be connected to a series of wire bonding pads 109 placed on a peripheral area of the printed circuit board 101 by a series of bonding wires 111a and 111b.

The bonding pads 103a and 105b, the wire bonding pads 109, and the bonding wires 111a and 111b may be sealed by an encapsulant 113, for example, an epoxy molding compound (EMC) or other polymer composition. An active surface of the second semiconductor chip 105 may be sealed with an upper BGA package. However, the active surface of the second semiconductor chip 105, i.e., the upper chip, in the other BGA packages 100b, 100c and 100d may be exposed to be connected to another adjacent BGA package. Also, the conductive circuit layer 120 may be formed on the exposed active surface of the second semiconductor chip 105.

Figure 4:
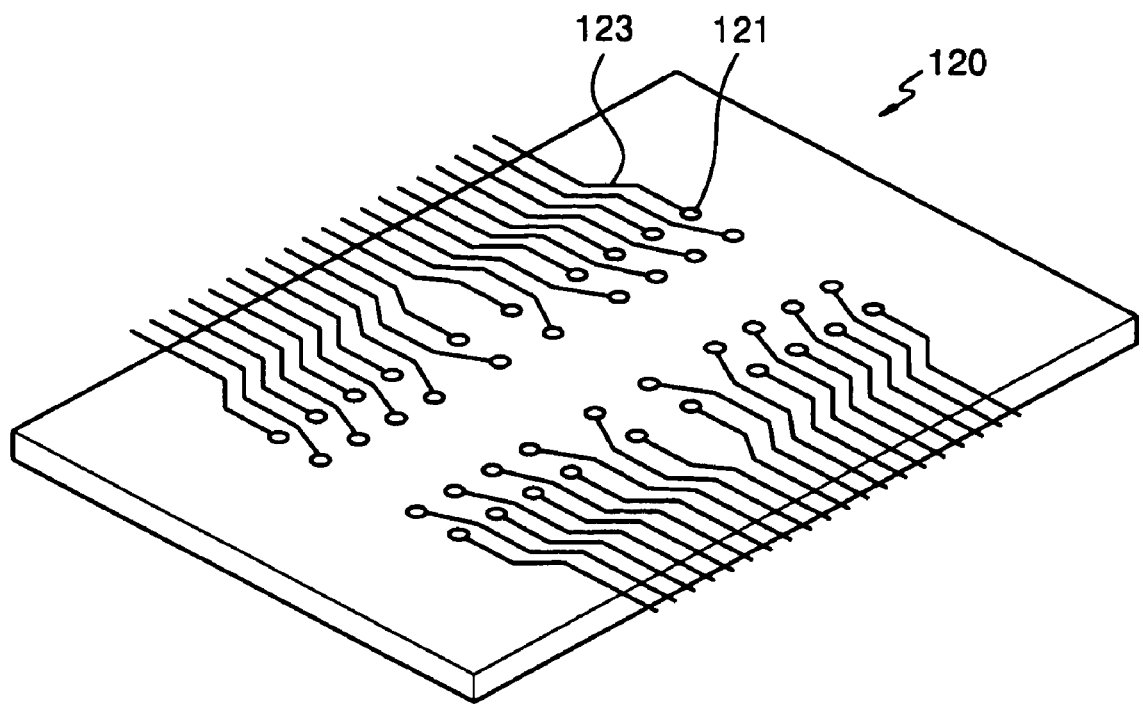
FIG. 4 is a plan view of a conductive circuit layer according to an exemplary embodiment of the present invention.

As illustrated in FIG. 4, the conductive circuit layer 120 may include a series of solder ball landing pads 121 and a series of conductive patterns 123, connected to corresponding the series of bonding pads 105a on the second semiconductor chip 105. The solder ball landing pads 121 and the conductive pattern 123 may be separated from adjacent solder ball landing pad 121 and/or conductive pattern 123 by an electrical insulator.

Figure 5A:
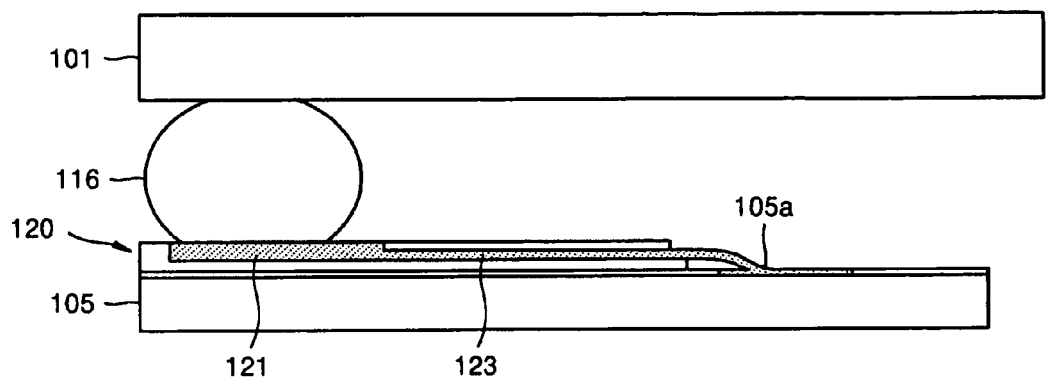
FIGS. 5a and 5b are exemplary, enlarged cross-sectional views of conductive circuit layer portions shown in FIG. 2.

Referring to FIG. 5a, the conductive circuit layer 120 may be a tape, in which the solder ball landing pad 121 and the conductive pattern 123 are formed. In detail, the conductive pattern 123 may be extended to contact to the bonding pad 105a. The solder ball 116 may be attached on the solder ball landing pad 121, and may be electrically connected to the bonding pad 105a by the conductive pattern 123.

Figure 5B:
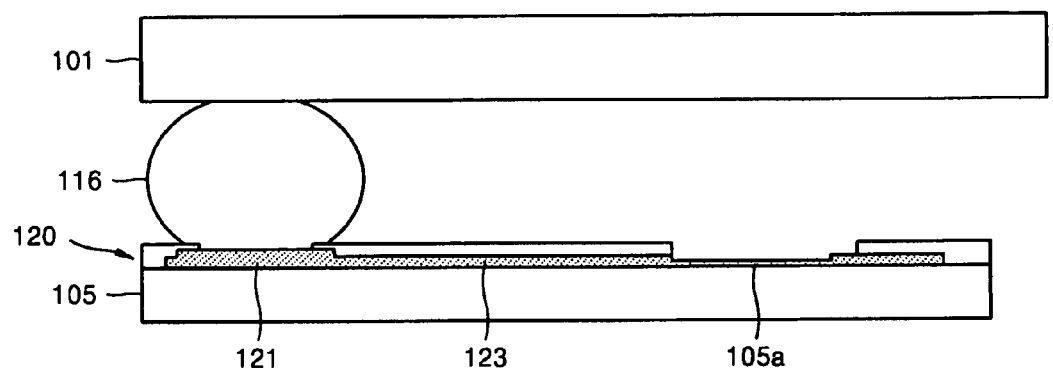

With reference to FIG. 5b, the conductive circuit layer 120 may be directly formed on the semiconductor chip. In a manufacturing process for semiconductor devices, i.e., forming the bonding pad 105a by a metal, the conductive circuit layer 120 may be formed with a formation of the bonding pad 105a, thereby patterning the solder ball landing pad 121 and the conductive pattern 123, simultaneously. In such an exemplary method, the conductive circuit layer 120 may be formed without an additional taping process and photolithography process.

Figure 6:
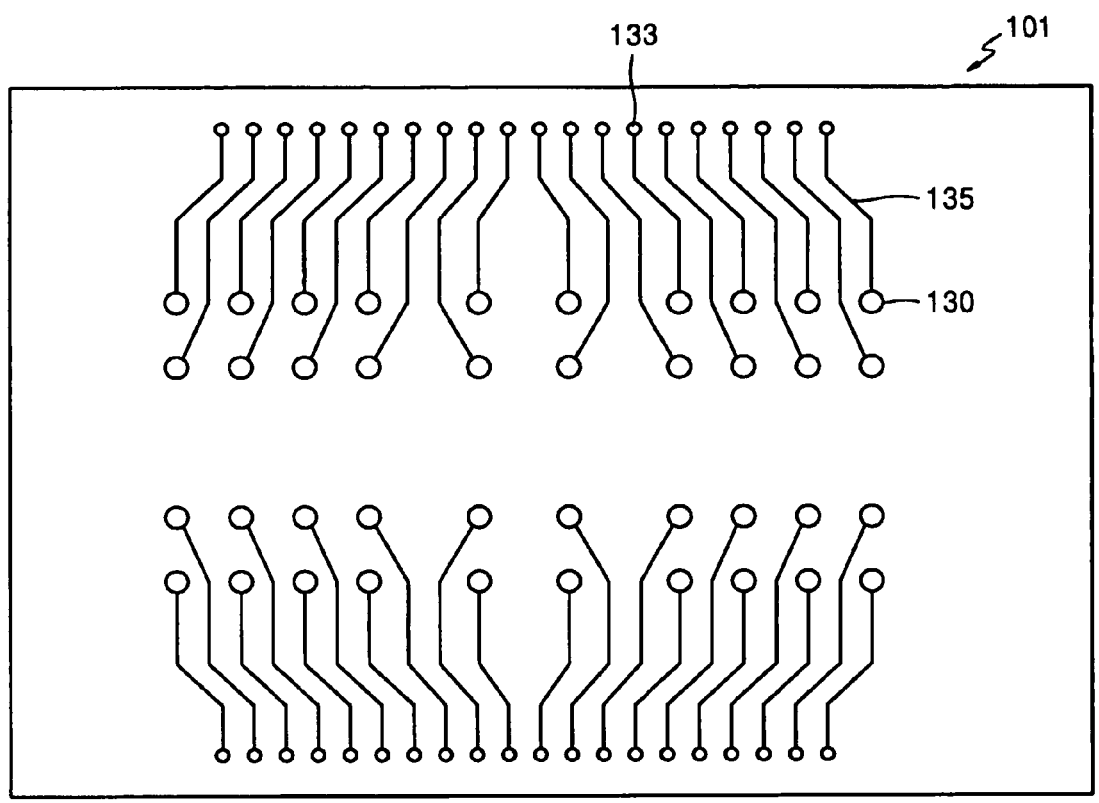
FIG. 6 is a plan view of the bottom of the conductive circuit layer according to an exemplary embodiment of the present invention.

Referring to FIG. 6, the underside of the printed circuit board 101 may provide the solder ball landing pads 130 to place the solder balls 115, a plurality of holes 133 for providing an electrical connection to the solder ball landing pads 130 and the wire bonding pads 109, and the conductive patterns 135. The holes 133 in the printed circuit board 101 may enable connection to the wire bonding pads 109, therefore a conductive material (not shown) may be plated and/or inserted inside the holes 133. The conductive patterns 135 may connect to the holes 133 and the solder ball landing pads 130. Each conductive pattern 125 may be separated from adjacent conductive patterns 135. The solder ball landing pads 130 which are placed on the underside of the printed circuit board 101 may be connected to the corresponding solder ball landing pads 121 on the conductive circuit layer 120 of the adjacent BGA package (not shown).

Furthermore, the solder balls 115 and 116 may be attached to solder ball landing pads 130 which are placed on the underside of the printed circuit board 101, and may then be soldered with the solder ball landing pads 121 of the conductive circuit layer 120 at the same time. The solder balls 115 of the base BGA package 100a need not be encapsulated, thereby enabling mounting to a main board (not shown). However, the solder balls 116 of the upper BGA packages 100b, 100c and 100d may be encapsulated to disperse any stress concentrated at the solder joint, to further protect the conductive circuit layer 120 and improve the package reliability. Thus, the BGA packages 100a through 100d may be electrically connected by the solder balls 115 and 116.

A method for manufacturing of the unit BGA package 100a through 100d according to an exemplary embodiment of the present invention will be now described.

Figure 7A:
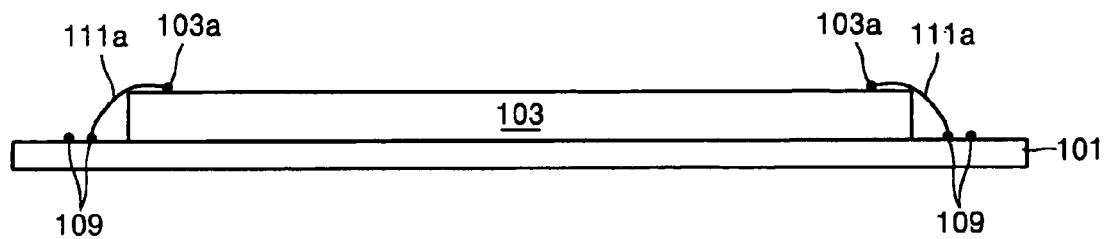
FIGS. 7a through 7c are cross-sectional views of the unit BGA package according to an exemplary embodiment of the present invention.

As illustrated in FIG. 7a, the first semiconductor chip 103 may be mounted on the printed circuit board 101, for example, by an adhesive material (not shown), such as an Ag epoxy or a polyimide tape. The solder ball landing pads 130 and the conductive patterns 135 may be formed on the underside of the printed circuit board 101. Also, the wire bonding pads 103a may be formed on a top peripheral area of the printed circuit board 101. The active surface of the first semiconductor chip 103 may be face up with respect to printed circuit board 101, thereby exposing the wire bonding pads 109. The bonding wires 111a may then be connected to the bonding pads 103a and the wire bonding pads 109.

Figure 7B:
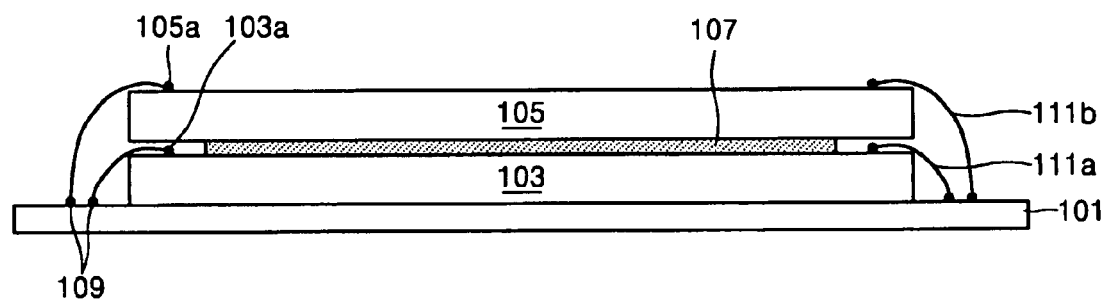

As illustrated in FIG. 7b, the second semiconductor chip 105 may be attached on the first semiconductor chip 103 by an adhesive layer 107, such as an adhesive material, such as an Ag epoxy or a polyimide tape. Also, the second semiconductor chip 105 may include the bonding pads 105, thereby connecting to the wire bonding pad 109 on the printed circuit board 101. Furthermore, the second semiconductor chip 105 may be essentially the same as the first semiconductor chip 103. The bonding wires 111b may then be electrically connected to the corresponding bonding pads 105a of the second semiconductor chip 105 and the wire bonding pads 109 on the printed circuit board 101.

Figure 7C:
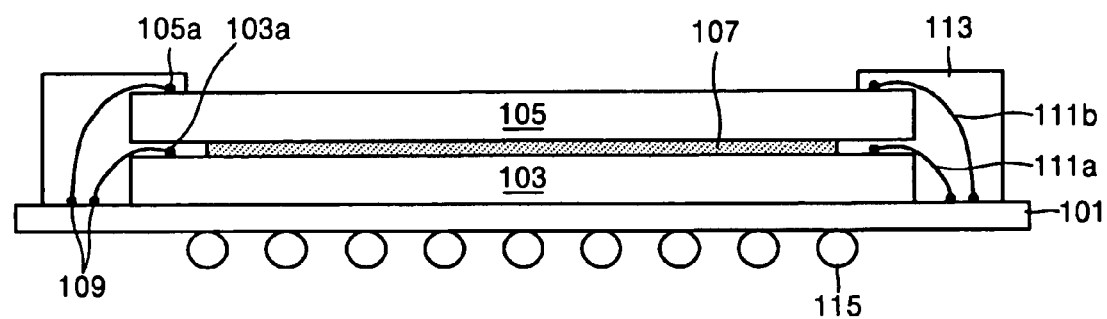

As illustrated in FIG. 7c, the first and second semiconductor chips 103 and 105, the bonding wires 111a and 111b may be sealed by the encapsulant 113 to be formed on a peripheral area of the printed circuit board 101, in order to provide protection from the external environment. The encapsulation 113 may expose a portion of the active surface of the second semiconductor chip 105, to stack other BGA packages 100b through 100d. In addition, the solder balls 115 may have an input/output function of the first and second semiconductor chips 103 and 105 may be soldered on the solder ball landing pads 130 of the printed circuit board 101, and thus the unit BGA package 100 may be completed.

The base BGA package 100a may be the lower BGA package of the stacked BGA package 200, and the solder balls 115 of the other BGA packages 100b, 100c, 100d may be sealed by encapsulant 140. The active surface of the second semiconductor chip 105 of the upper BGA package 100d may be completely sealed, because an additional unit BGA package does not need to be stacked.

Figure 8A:
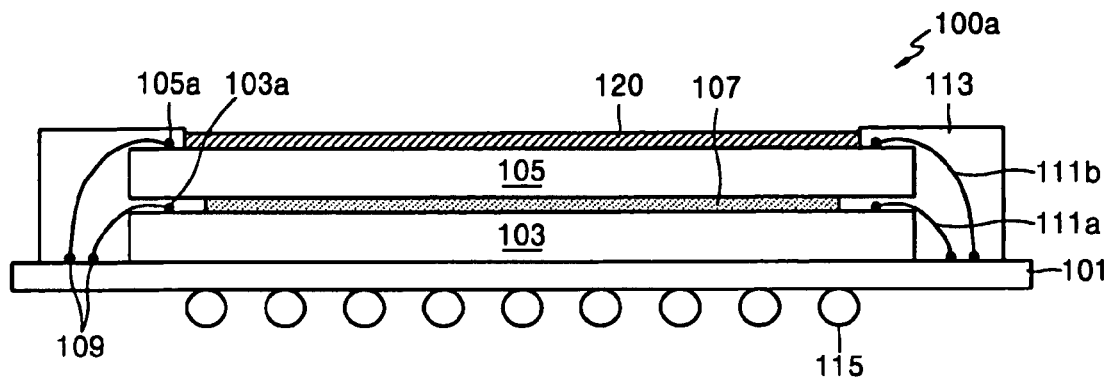
FIGS. 8a and 8b are cross-sectional views of the stacked BGA package according to an exemplary embodiment of the present invention.

Hereafter, a method for manufacturing the stacked BGA package 200 according to an exemplary embodiment of the present invention will be now described. Referring to FIG. 8A, the conductive circuit layer 120 may be formed on an exposed active surface of the second semiconductor chip 105 of the BGA package 100a. The conductive circuit layer 120 may further include the solder ball landing pads 121 and the conductive patterns 123, as shown in FIG. 4. If the conductive circuit layer 120 is of a tape type, the conductive circuit layer 120 may be formed the same as a metal layer used to form the bonding pad 105a on the second semiconductor chip 105.

Figure 8B:
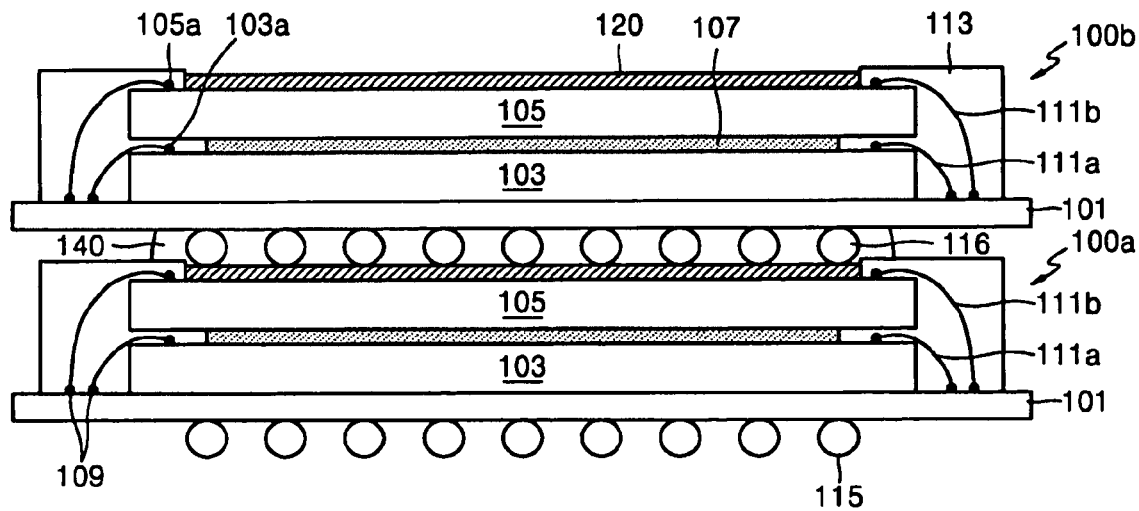

Referring to FIG. 8B, the solder balls 116 of another BGA package 100b may be placed on the conductive circuit layer 120 of the base BGA package 100a. The BGA package 100b may have been electrically tested and may have the same or different functionality as the base BGA package 100a. The solder balls 116 of the BGA package 100b may contact the solder ball landing pads 121 of the conductive circuit layer 120 on the base BGA package 100a. Therefore, the BGA packages 100a and 100b may be electrically connected. The solder balls 116 of the BGA package 100b may be sealed by the encapsulant 140, thereby dispersing stress applied to the solder balls 116 and/or protecting the conductive circuit layer 120. Another BGA package 110c may be stacked on the BGA package 100b by the above described method. As described above, the conductive circuit layer 120 need not be formed on the second semiconductor chip 105 of the upper BGA package 100d, and the encapsulation 113 may be formed to cover the active surface of the second semiconductor chip 105.

In this manner, the stacked BGA package 200 (which may be considered a CSP) may provide the solder balls 115 on the underside of the semiconductor chip 103 for attachment thereto. Also, the stacked BGA package 200 may be manufactured without an additional flexible board, thereby increasing reliability and/or decreasing signal delay of the semiconductor chips 103 and 105.

Figure 9:
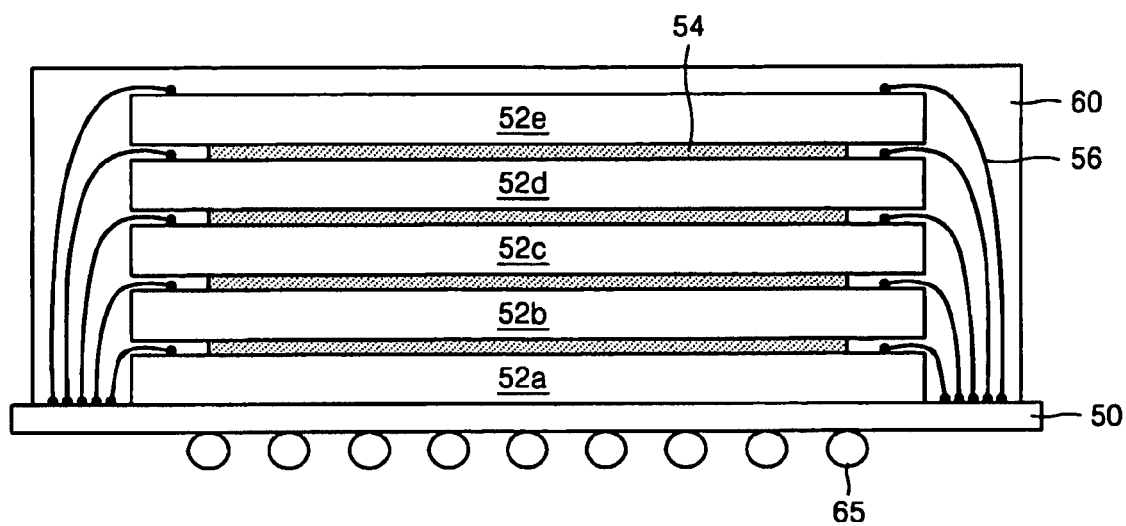
FIG. 9 is a cross-sectional view of a conventional multi chip BGA package.

According to exemplary embodiments of the present invention, the stacked BGA package 200 includes a plurality of BGA packages 100a through 100d having at least one semiconductor chip 103 and/or 105, may decrease the height of the stacked package compared with the stacked package having one semiconductor chip in a unit package. For instance, a plurality of semiconductor chips 52a through 52e are stacked in a conventional package body 60 as shown in FIG. 9. One of the semiconductor chips 52a through 52e may experience an electrical failure, and as a result, the entire conventional multi-chip package may fail. However, the stacked BGA package 200 according to exemplary embodiments of the present invention may have a lower electrical/mechanical failure rate than the conventional multi chip package, by enabling the completion of testing of the unit BGA packages 100a through 100d before the stacking process.

Figure 10:
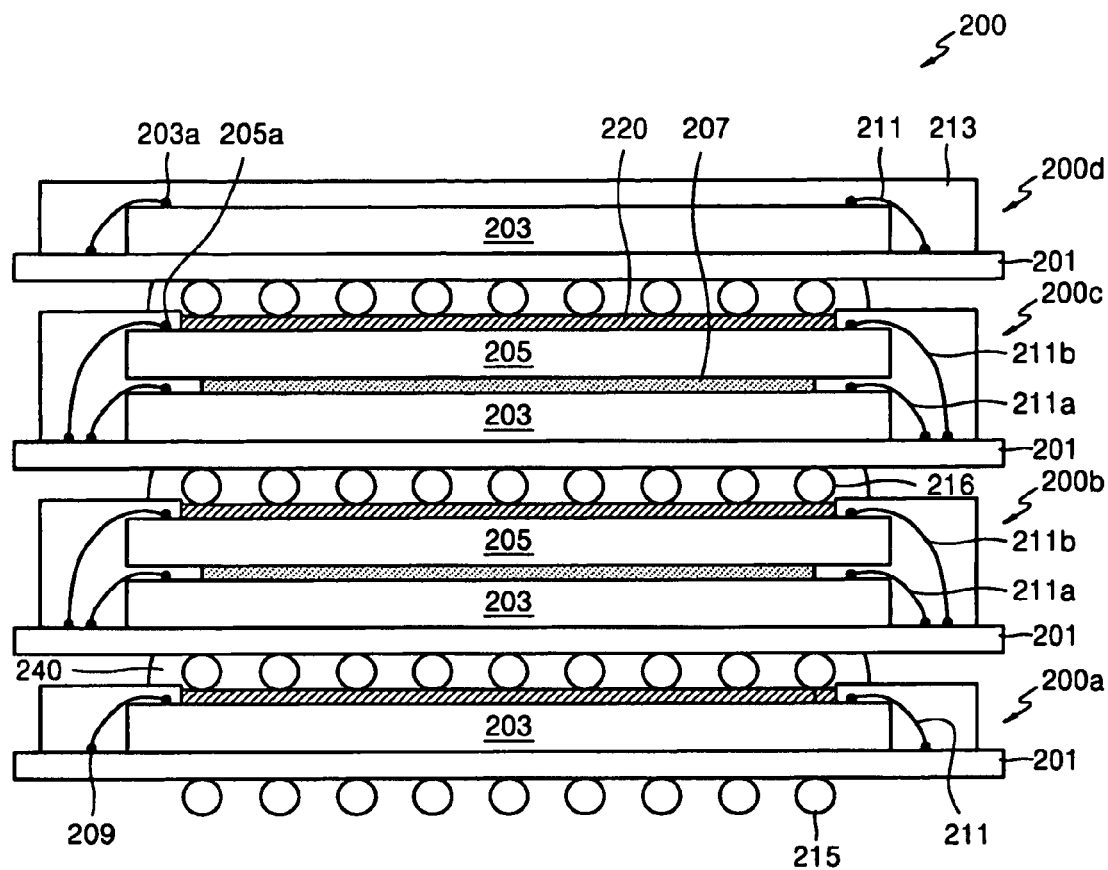
FIG. 10 is a cross-sectional view of a stacked BGA package according to another exemplary embodiment of the present invention.

The stacked BGA package 200 according to another exemplary of the present invention will be now described. Referring to FIG. 10, a stacked BGA package 200 may include a plurality of BGA packages 200a through 200d, and each BGA package 200a through 200d may have any number of semiconductor chips 203 and 205. For instance, the first and fourth BGA packages 200a and 200d may include one semiconductor chip 203 and the second and third BGA packages 200b and 200c may include two semiconductor chips 203 and 205. Thus, the first and fourth BGA packages 200a and 200d may include a printed circuit board 201 to which the one semiconductor chip 203 is attached. A plurality of bonding pads 203a may be formed on a peripheral area of the semiconductor chips 203 and 205 and a plurality of wire bonding pads 209 may be formed on a peripheral area of the printed circuit boards 201. Also, a series of bonding wires 211 may be connected to the corresponding plurality of bonding pads 203a and wire bonding pads 209. The encapsulant 213 may be sealed to protect the bonding pads 203a, the wire bonding pads 209, and the bonding wires 211 on a top portion of the printed circuit board 201.

In the first BGA package 200a, the encapsulant 213 may be sealed to expose an active surface of the semiconductor chip 203, thereby enabling the stacking of the second BGA package 200b. However, the active surface of the semiconductor chip 203 in the fourth BGA package 200d may be completely sealed because an additional BGA package need not be stacked. A plurality of solder balls 215 acting as electrical connection terminals may be attached to an underside of the printed circuit board 201. The plurality of solder balls 215 of the fourth BGA package 200d may be sealed by the encapsulant 240. In addition, a conductive circuit layer 120 may be formed on a top surface of the first BGA package 200a thereby enabling the stacking of the second BGA package 200b.

In an exemplary embodiment, the second and third BGA package 200b and 200c may also include the printed circuit board 201, the first and second semiconductor chips 203 and 205, to which a series of bonding wires 211a and 211b may be connected to the plurality of wire bonding pads 209 and the plurality of bonding pads 203a and 205a, the encapsulant 213, and the plurality of solder balls 216 that are used to connect to the printed circuit board 201. Even though various semiconductor chips may be mounted in the stacked BGA package 200, similar efficiency may be achieved.

As mentioned above, exemplary embodiments of the present invention may reduce the likelihood of damage to semiconductor chips and solder balls during the manufacture of stacked BGA packages. Exemplary embodiments of the present invention may also reduce the height of the stacked BGA package relative to the stacked package having one semiconductor chip in a unit package, thereby allowing a thinner stacked package to be produced. The solder balls which are connected to the unit BGA packages may be encapsulated to disperse the stress, caused by protecting the conductive circuit layer. As a result, the reliability of a semiconductor package may be improved.

Although the invention has been described with reference to various aspects and exemplary embodiments thereof, it will be apparent to those of ordinary skill in the art that various modifications and adaptations to the described embodiments may be made without departing from the spirit and scope of the invention as defined in the appended claims.

What is claimed is:

1. A stacked BGA package comprising:
   a first BGA package including a first semiconductor chip and a printed circuit board, the first semiconductor chip positioned to face upward with respect to the printed circuit;
   a conductive layer disposed on the first semiconductor chip of the first BGA package, the conductive layer including a first solder ball landing pad directly formed on a surface of the first semiconductor chip of the first BGA package and a first conductive pattern connected to the first solder ball landing pad;
   at least one second BGA package including a second semiconductor chip and being mounted on the first BGA package;
   a first solder ball attached to a printed circuit board of the second BGA package and connected to the printed circuit board of the first BGA package via the first solder ball landing pad of first conductive layer; and
   an electrical connection connecting the first conductive pattern to the printed circuit board of the first BGA package.

2. The stacked BGA package of claim 1, wherein the electrical connection is a bonding wire.

3. The stacked BGA package of claim 2, further comprising a bonding pad connected to the first conductive pattern and disposed on the first semiconductor chip of the first BGA package, the bonding pad being connected to the bonding wire.

4. The stacked BGA package of claim 1, wherein the first BGA package includes a third semiconductor chip disposed under the first semiconductor chip.

5. The stacked BGA package of claim 1, wherein the conductive layer of the first BGA package includes a second solder ball landing pad and a second conductive pattern connected to the second solder ball landing pad.

6. The stacked BGA package of claim 5, wherein the first conductive pattern includes a first conductive line extending from the first solder ball landing pad toward one edge of the first semiconductor chip of the first BGA package and the second conductive pattern includes a second conductive line extending from the second solder ball landing pad towards an edge opposite the one edge of the first semiconductor chip of the first BGA package.

7. The stacked BGA package of claim 6, wherein the first and second conductive lines terminate adjacent the one edge and opposite edge, respectively.

8. The stacked BGA package of claim 6, further comprising a second solder ball attached to the printed circuit board of the second BGA package and electrically connected to the printed circuit board of the first BGA package via the second solder ball landing pad and second conductive line.

9. The stacked BGA package of claim 8, further comprising another bonding wire connected to the second conductive line and the printed circuit board of the first BGA package.

10. The stacked BGA package of claim 1, wherein the electrical connection connecting the first conductive pattern to the printed circuit board comprises a wire bond extending from a top surface of the first semiconductor chip to the printed circuit board of the first BGA package.

11. The stacked BGA package of claim 10,
wherein the first conductive pattern of the conductive layer includes a wire bond pad, and
wherein the wire bond pad and the remainder conductive layer are formed at substantially the same level.

12. The stacked BGA package of claim 1,
wherein the electrical connection connecting the first conductive pattern to the printed circuit board comprises a wire bond,
wherein the first conductive pattern of the conductive layer includes a wire bond pad to which the wire bond is attached, and
wherein the entire conductive layer is formed of a same patterned layer formed on the surface of the first semiconductor chip and confined between the edges of the first semiconductor chip.

13. The stacked BGA package of claim 1, wherein an electrical signal path from the first solder ball to the printed circuit board of the first BGA package is formed by at least the conductive layer and the electrical connection and the electrical signal path has no electrical connections to the first semiconductor chip along the electrical signal path.

14. The stacked BGA package of claim 1,
wherein the first conductive pattern of the conductive layer includes a connection pad to which the electrical connection is directly connected, and the entire conductive layer is formed substantially at the same level.

15. The stacked BGA package of claim 14, wherein the first conductive pattern is formed of a patterned conductive layer.

16. The stacked BGA package of claim 15, wherein the first conductive pattern is formed from a photolithography process.

17. The stacked BGA package of claim 1, wherein the first conductive pattern is formed from a photolithography process.

18. The stacked BGA package of claim 1, wherein the first BGA package includes plural semiconductor chips including the first semiconductor chip and the second BGA package includes plural semiconductor chips including the second semiconductor chip.

19. The stacked BGA package of claim 18, wherein the plural semiconductor chips of the first and second packages are stacked in a direction which is the same as the direction in which the first and second BGA packages are stacked.

20. An electronic product including a stacked BGA package, the BGA package comprising:
a first BGA package including a lower semiconductor chip, an upper semiconductor chip and a printed circuit board, the upper semiconductor chip being positioned face up with respect to the printed circuit board;
at least one second BGA package, including at least one semiconductor chip and a printed circuit board, the second BGA package mounted on the first BGA package; and
a solder ball attached to the printed circuit board of the second BGA package and electrically connected to the printed circuit board of the first BGA package via a conductive layer disposed between the upper semiconductor chip of the first BGA package and the solder ball, the conductive layer comprising a solder ball landing pad directly formed on a top surface of the upper semiconductor chip of the first BGA package and a conductive pattern connected to the solder ball landing pad.

21. A stacked BGA package comprising:
a first BGA package including at least one semiconductor chip and a printed circuit board;
at least one second BGA package, including at least one semiconductor chip mounted on the first BGA package; and
a plurality of solder balls attached to a printed circuit board of the second BGA package and electrically connected to the first BGA package and the second BGA package via a conductive circuit layer disposed directly on an uppermost one of the at least one semiconductor chip of the first BGA package,
wherein the uppermost one of the at least one semiconductor chip of the first BGA package faces upward with respect to the printed circuit board of the first BGA package,
wherein the solder ball being connected to the at least one second BGA package, is sealed by the encapsulant.

22. A stacked BGA package comprising:
a first BGA package including at least one semiconductor chip and a printed circuit board;
at least one second BGA package, including at least one semiconductor chip mounted on the first BGA package; and
a plurality of solder balls attached to a printed circuit board of the second BGA package and electrically connected to the first BGA package and the second BGA package via a conductive circuit layer disposed between the first BGA package and the plurality of solder balls,
wherein at least one semiconductor chip of the first BGA package faces upward with respect to the printed circuit board of the first BGA package,
wherein the first BGA package and the at least one second BGA package mounted on the first BGA package, each BGA package comprising:
the printed circuit board including a plurality of wire bonding pads, a plurality of solder ball landing pads correspondingly electrically connected to the plurality of wire bonding pads;
at least one semiconductor chip including a plurality of bonding pads is mounted on the printed circuit board;
a plurality of bonding wires correspondingly electrically connected to the plurality of bonding pads and the plurality of solder ball landing pads;

an encapsulant sealing a portion of the printed circuit board to protect the plurality of wire bonding pads, the plurality of bonding pads and the plurality of bonding wires; and the plurality of solder balls connected to the solder ball landing pad of the printed circuit board, wherein for at least the first BGA package, an active surface of an uppermost semiconductor chip of the first BGA package is exposed with respect to the encapsulant sealing a portion of the printed circuit board.

23. A stacked BGA package comprising:

a first BGA package including at least a first semiconductor chip and a printed circuit board;

at least one second BGA package, including at least one semiconductor chip mounted on the first BGA package; and a plurality of solder balls attached to a printed circuit board of the second BGA package and electrically connected to the first BGA package and the second BGA package via a conductive circuit layer disposed between the first BGA package and the plurality of solder balls, wherein the first semiconductor chip of the first BGA package faces upward with respect to the printed circuit board of the first BGA package, wherein the first semiconductor chip of the first BGA package includes a bonding pad, wherein the conductive circuit layer includes solder ball landing pads and conductive patterns which are formed with the same metal layer as the bonding pad.

* * * * *